United States Patent [19]

Bouvier et al.

[11] Patent Number: 4,668,032
[45] Date of Patent: May 26, 1987

[54] FLEXIBLE SOLDER SOCKET FOR CONNECTING LEADLESS INTEGRATED CIRCUIT PACKAGES TO A PRINTED CIRCUIT BOARD

[75] Inventors: Ray A. Bouvier; Leonard T. Hesch, Jr., both of Palm Bay, Fla.

[73] Assignee: Harris Corporation, Melbourne, Fla.

[21] Appl. No.: 654,573

[22] Filed: Sep. 26, 1984

Related U.S. Application Data

[63] Continuation of Ser. No. 366,783, Apr. 8, 1982, abandoned.

[51] Int. Cl.⁴ .............................................. H01R 9/09
[52] U.S. Cl. .............................. 339/17 CF; 339/174
[58] Field of Search ............ 339/17 CF, 17 GM, 174; 174/52 FP

[56] References Cited

U.S. PATENT DOCUMENTS

| | | | |
|---|---|---|---|
| 3,735,214 | 5/1973 | Renskers et al. | 174/52 FP X |
| 3,877,064 | 4/1975 | Scheingold et al. | 339/17 CF X |
| 4,037,270 | 7/1977 | Altmann et al. | 339/17 CF X |
| 4,052,118 | 10/1977 | Scheingold et al. | 339/17 CF |
| 4,222,622 | 9/1980 | Griffin et al. | 339/17 CF |
| 4,330,163 | 5/1982 | Aikens et al. | 339/17 CF |

Primary Examiner—Eugene F. Desmond
Attorney, Agent, or Firm—Antonelli, Terry & Wands

[57] ABSTRACT

A connector arrangement for interconnecting a leadless integrated circuit package to a printed circuit board by means of a flexible solder socket, for eliminating the problems of thermal stress and vibration in the chip-to-printed circuit board connection. The arrangement includes a plurality of substantially L-shaped flexible connectors arranged in a pattern along the edge of an insulated substrate that coincides with the arrangement of chip contact areas on the periphery of the integrated circuit package that is to be connected to the printed circuit board. Bottom portions of the L-shaped flexible connectors are soldered to the conductor highways on the printed circuit board. The upper leg portion of the L-shaped flexible joint connector member is bent around the edge of the insulated carrier and contacts chip contact layers along the edge of the integrated circuit chip. In the region of the edge of the insulated carrier substrate where the L-shaped member is bent, there is no bonding between the substrate and the L-shaped flexible connector, permitting the upper leg of the L-shaped flexible connector to flex in a direction parallel to the surface of the printed circuit board. A solder connection is provided between the contact layers on the edge of the integrated circuit chip and the upper arm of the L-shaped flexible connector. Those portions of the L-shaped flexible connector which are soldered to either the chip or the board undergo substantially no stress.

21 Claims, 6 Drawing Figures

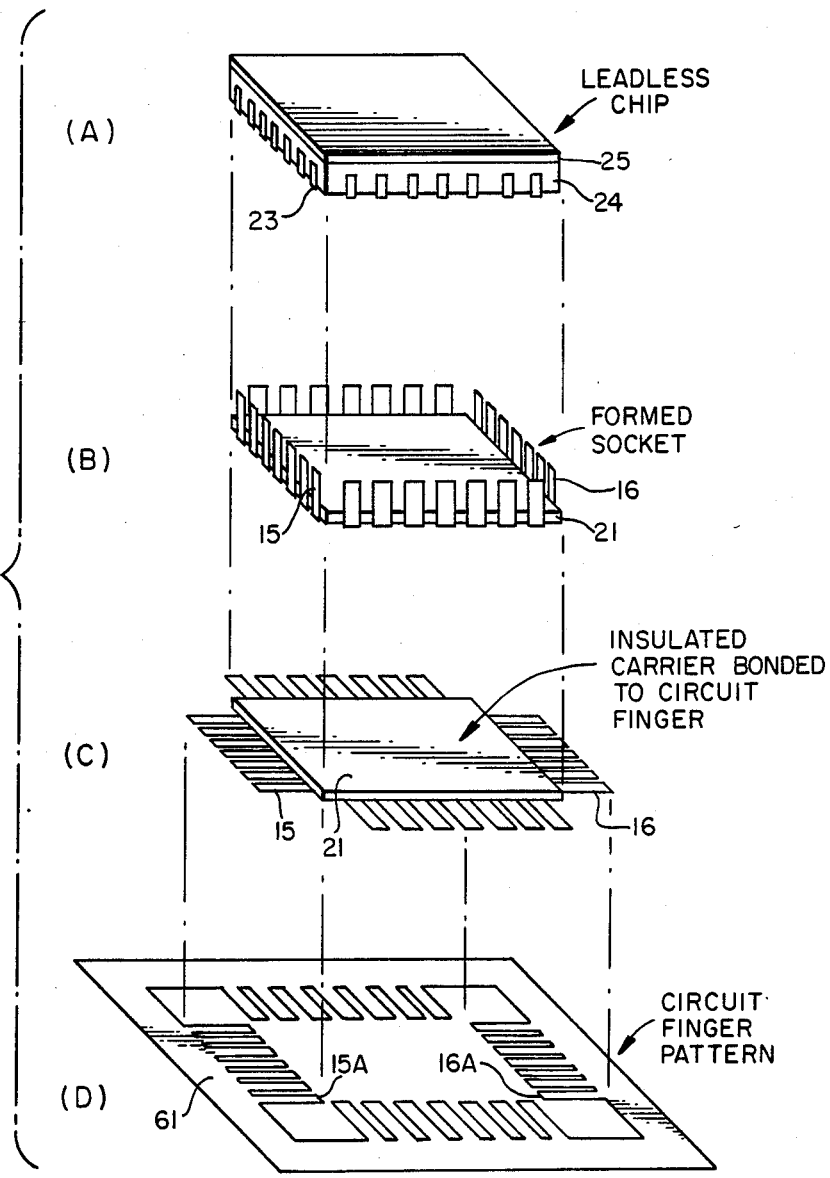

FLEXIBLE SOLDER SOCKET FOR CONNECTING LEADLESS INTEGRATED CIRCUIT PACKAGES TO A PRINTED CIRCUIT BOARD

This is a continuation of application Ser. No. 366,783, filed Apr. 8, 1982, now abandoned.

FIELD OF THE INVENTION

The present invention relates in general to a solder connector for mounting a circuit element, such as a large scale integrated circuit package to a printed circuit board, particularly wherein the coefficients of thermal expansion of the connector and the printed circuit board may be different.

BACKGROUND OF THE INVENTION

With the increasing miniaturization of electronic circuit components and the wide variety of applications for integrated circuit devices, there have been a number of efforts to securely package and mount integrated circuit chips to printed circuit boards. These have included leadless integrated circuit packages which may be inserted into a spring-loaded connector arrangement for purportedly securely retaining and providing electrical contact between the contact lead areas on the integrated circuit package and electrical conductor highways of the printed circuit board. Examples of mounting and connection configurations for this purpose are described in the U.S. Pat. Nos. 4,155,615, to Zimmerman, Jr. et al, 3,910,664, to Pauza et al, 3,877,064 to Scheingold et al, and 4,089,575, to Grabbe.

Basically, each of the schemes described in these patents employs a set of multiple contact connector members, each being spring-loaded or spring-biased to engage contacts provided on the periphery of the integrated circuit package that is to be retained by the connector which is mounted on the printed circuit board. According to the descriptions in the patents, the spring-loaded or biased connector members offer the facility of easy insertion and removal of the integrated circuit chip. Grabbe also mentions the desire to accommodate differences in the coefficients of thermal expansion of the connector and the substrate through a set of cooperating and interlocking spring-biased connector terminals, one of which is mounted to the circuit board and the other of which is mounted on the integrated circuit package. The connector which is mounted on the circuit board has a shape which follows a tortuous path which engages the inner walls of a surrounding plastic frame. When the chip carrier is inserted into the socket comprised of the plastic frame and the tortuous path-shaped terminal, bent around terminal portions of the chip carrier frame engage the terminals at prescribed locations in an effort to provide electrical contact therebetween.

Unfortunately, in each of the types of connectors described in the above patent literature, because the electrical connections between the printed circuit board the integrated circuit chip are to be achieved through mechanical friction-contact, spring-loaded or biased contact connectors, they suffer from drawbacks that limit their application and effectiveness. For example, the spring-loaded connector terminal of each arrangement is comprised of a substantial amount of material, extending from the printed circuit board and following a tortuous path, usually back over itself, to effect the necessary spring action. This usually means that a support member, such as the plastic shield of Grabbe or the housing of Pauza et al, must be provided to support the spring-configured terminal connectors. Not only does this add additional weight to the connector, but it substantially reduces the packaging density for the printed circuit board.

Another drawback is the fact that the connections that are achieved between the integrated circuit package and the printed circuit board are effectively mechanical frictional contacts. An effectively continuous electrical path between the lead contact areas on the integrated circuit chip and the conductor highways on the printed circuit board is not necessarily guaranteed; the chip-to-printed circuit board interconnection highway path is subject to discontinuities in the presence of environmental vibrations.

Because of these drawbacks, the connectors of the type described in the above patent literature are not readily suited for applications which are subject to substantial changes in environmental conditions, such as temperature and vibration. While Grabbe purports to solve the temperature fluctuation problem, he does so by employing a package that significantly reduces the integration density on the printed circuit board, adds considerable weight to the components that are mounted on the board and does not guarantee a permanent electrical connection between the chip and the board.

SUMMARY OF THE INVENTION

In accordance with the present invention, there is provided an improved chip-to-printed circuit board connector arrangement that overcomes the above-mentioned deficiencies of the prior art and which offers a considerable savings in materials, weight and usable printed circuit board real estate.

In accordance with the present invention, there is provided a connector arrangement for interconnecting a leadless integrated circuit package to a printed circuit board by means of a flexible solder made of solder connections and flexible members that are capable of eliminating the problems of thermal stress in the chip-to-printed circuit board connection while providing a permanent electrical connection between the chip and the conductor highways on the board. For this purpose, a plurality of substantially L-shaped flexible connectors are mounted along the edge of an insulated carrier substrate. These L-shaped connectors are arranged in a pattern along the edge of the substrate that coincides with the arrangement of chip contact areas on the periphery of the integrated circuit package that is to be connected to the printed circuit board. Bottom portions of the L-shaped flexible connectors are soldered to the conductor highways on the printed circuit board. The upper leg portion of the L-shaped flexible connector member is bent around the edge of the insulated carrier and contacts chip contact layers along the edge of the integrated circuit chip. In the region of the edge of the insulated carrier substrate where the L-shaped member is bent, there is no bonding between the insulated carrier substrate and the L-shaped flexible connector. This permits the upper leg of the L-shaped flexible connector to flex in a direction parallel to the surface of the printed circuit board. A solder connection is provided between the contact layers on the edge of the integrated circuit chip and the upper arm of the L-shaped flexible connector. Because of the flexible characteristic of the L-shaped flexible connector in the region of the side of the carrier substrate, changes in environmental conditions, e.g. vibrations and changes in temperature, do not create a discontinuity problem in the electrical highways between the integrated circuit chip and the printed circuit board. Those portions of the L-shaped flexible connector which are soldered to either the chip or the board are located at portions of the connector which undergo substantially no stress, the stress being borne by that portion of the L-shaped flexible connector which is permitted to flex. Furthermore, because the flexing location of the L-shaped flexible connector is at an area of the insulating substrate that contains no bonding material, there is no danger of the formation of a stress created at the solder joint location.

BRIEF DESCRIPTION OF THE DRAWINGS

FIG. 6 shows portions of the connector and integrated circuit chip for purposes of explaining the method of manufacture and interconnection of the connector arrangement of the present invention.

DETAILED DESCRIPTION

Figure 1:
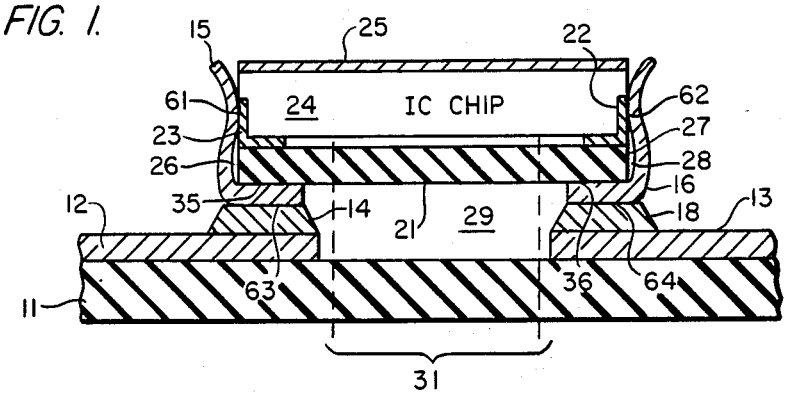
FIG. 1 shows an exaggerated cross-sectional sideview of a chip-circuit board interconnection arrangement in accordance with the present invention.

Referring now to FIG. 1 of the drawings, there is shown an exaggerated cross-sectional sideview of the connector arrangement in accordance with the present invention. By exaggerated is meant the fact that the apparent relative dimensions of the elements shown in FIG. 1 are not precise but have been illustrated in a manner to facilitate an understanding of the present invention by those skilled in the art. As a typical (but non-limiting) example, the present description may be considered to apply to a connection arrangement for an integrated circuit chip package on the order of 1.5 cm square and approximately 0.15 cm thick. It should be realized however, that these exemplary dimensions are given simply to demonstrate the application of the invention to typical packaging sizes. Of course, depending upon the actual size of the components (IC chip and PCB highways) to be interconnected, the dimensions of the interconnecting components of which the invention is comprised may be tailored to fit the precise requirements of the intended packaging and board configurations.

The integrated circuit package itself, chip 24 as shown in FIG. 1, is to be connected to a pattern of conductor highways, 12 and 13 of which are shown, on a printed wiring board 11. The integrated circuit chip 24 is of the leadless type having edge contact areas 22 and 23 for connecting the internal components of the chip to the external world. The top of the chip 24 is protected by way of a plastic or metal cover 25. It should be observed that the integrated circuit chip 24 itself is of a conventional configuration as pointed out above and does not, per se, form part of the present invention. The invention, rather, is directed to the connector arrangement for interconnecting the integrated circuit chip with the highway pattern on the printed wiring board.

For this purpose, the connection arrangement of the present invention includes respective flexible connectors, 15 and 16 of which are shown in FIG. 1, each of which has a substantially L-shaped cross-sectional configuration as shown. Each flexible connector may be comprised of a suitable lead material that provides both strength and good electrical conductivity. For this purpose, gold plated (zero to one-fourth hardness) beryllium may be employed. The bottom surface of flex connector 15 is electrically and physically connected to highway 12 on printed wiring board 11 by way of a layer of solder material 14. Similarly, the bottom surface of L-shaped flexible joint connector 16 is connected to the upper surface of conductive layer 13 of printed wiring board 11 by way of solder layer 18. Each of flexible connectors 15 and 16 is joined to an insulated carrier substrate 21 at regions 35 and 36 and is bent around the peripheral edge 27 of the substrate 21 to form the upper leg of the L-shaped flexible connectors. The particular manner in which these flexible connectors may be attached to the insulated carrier substrate 21 will be described in detail below with reference to FIGS. 4 and 5. For the purposes of describing the configuration shown in FIG. 1, suffice it to say that in the region of the sideface of substrate 21 a respective gap 26, 28 may be provided between the upper leg portion of each of flexible connectors 15 and 16 and the substrate 21. The edgewise dimensions of substrate 21 correspond to those of integrated circuit chip 24, while the material of which the carrier substrate is made is chosen to have a coefficient of thermal expansion approximately matching that of the printed wiring board 11. I.e. the same material may be used for both.

Because its upper leg portion is bent around the edge of substrate 21, each of the flexible connectors 15 and 16 is urged against and contacts chip contact layers 23 and 22 at regions 61 and 62, respectively. At these regions 61 and 62 and at regions 63 and 64 between the bottom surface of each of flexible connectors 15 and 16 and solder layers 14 and 18, each of the flexible connectors may be tinned. Solder material is introduced at these regions during manufacturing to provide a continuous electrical bond at each of the regions 61, 62, 63 and 64. As a result, the integrated circuit chip 24 is continuously electrically connected to the conductor highways on the printed wiring board 11.

Figure 2:
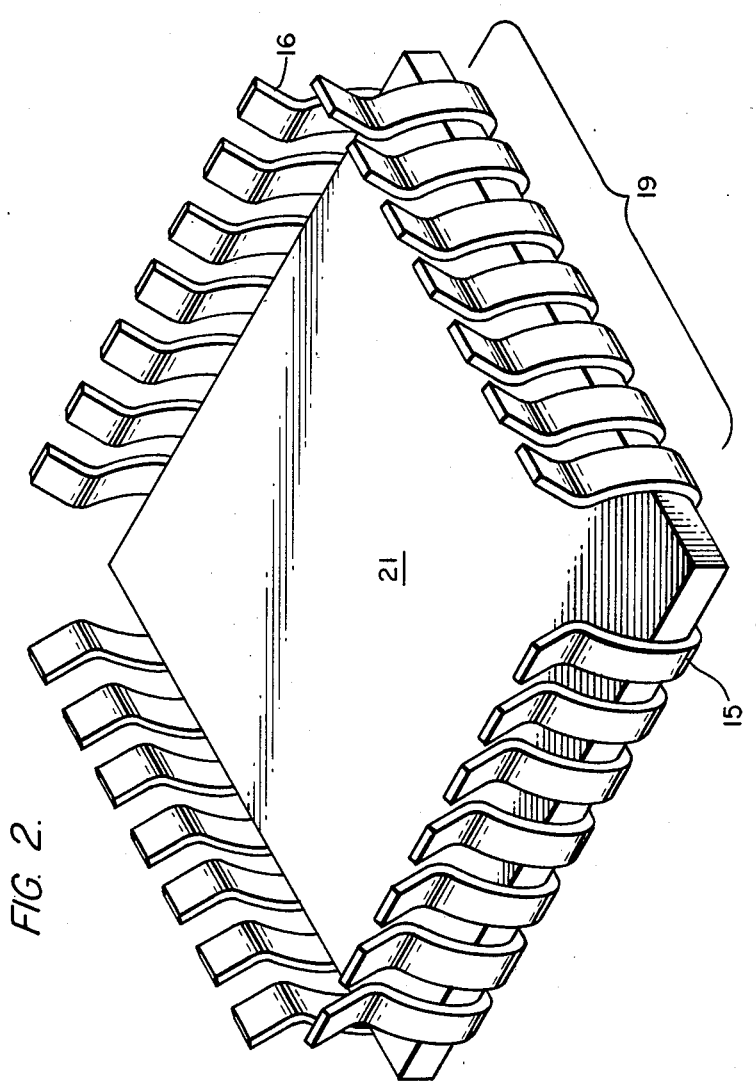
FIG. 2 shows a pictorial view of the insulated carrier substrate and flexible connector portion of FIG. 1.
Figure 3:
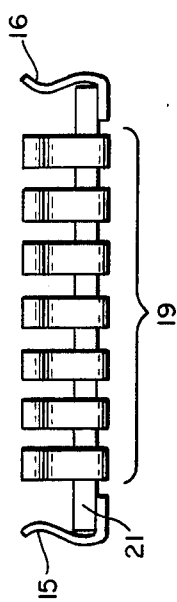
FIG. 3 is a sideview of the flexible connector and insulated carrier substrate portion of FIGS. 1 and 2.

Referring to FIGS. 2 and 3, pictorial and sideview illustrations of the insulated carrier substrate 21 and the array of flexible connectors disposed therearound are shown. Only flexible joint connectors 15 and 16, described above with reference to FIG. 1, are identified in the Figures to simplify the drawings. Reference numeral 19 designates a set of flexible joint connectors along one edge of the insulated carrier substrate 21 between those edges at which flexible connectors 15 and 16 are provided.

Figure 4:
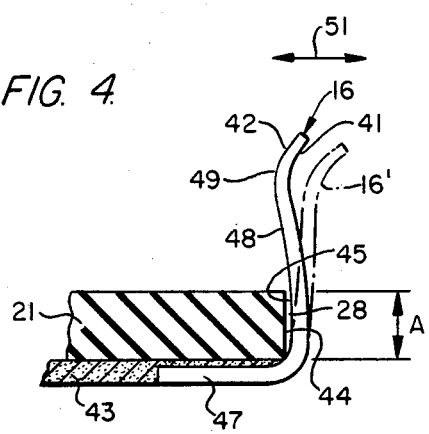
FIG. 4 is an enlarged cross-sectional sideview of a flexible connector and insulated carrier substrate, where the flexible connector is bonded to the bottom of the carrier substrate.

Referring now to FIG. 4, an illustration of the detail of the shape and mounting of an individual flex connector to the insulated carrier substrate 21 is shown. Referring to the Figure, flexible connector 16 is shown as being bonded by way of a bonding material 43 to the bottom of insulated carrier substrate 21. Bonding material may be a suitable epoxy adhesive. Flexible connector 16 includes a bottom portion 47 and an upper leg portion 48. At the end 41 of the upper leg portion 48, flexible connector 16 is bent back away from the edge of the substrate 21 at a region 42 to facilitate insertion of the integrated circuit chip and engagement of contact layer 22 with a region 49 that protrudes towards the contact layer 22 in the inserted position of the chip. For a substrate thickness of 0.5 mm and an upper leg height of 1.8 mm, region 49 may extend over the edge of substrate 21 by a protruding dimension of 0.1 to 0.25 mm. An inner surface portion 45 of the upper leg 48 which faces the side edge 44 of the insulated carrier substrate 21 may be separated from the side edge 44 by a gap 28 therebetween. The bonding material 43 which joins the bottom leg portion 47 of the flexible connector 16 to the bottom edge surface of the insulated carrier substrate 21 is preferably flush with or slightly below the bottom edge of bottom portion 47 of connector 16, but does not enter into the gap 28. The extent of the gap 28 is defined by the thickness of substrate 21 and the separation between the inner surface portion 45 of upper leg 48 and the side edge 44 at a region A. The separation may be on the order of 0.1 mm with a substrate thickness of 0.5 mm. Because the material of insulated carrier substrate 21, like printed wiring board 11, is nonwettable, solder is not capable of sticking to it, so that the adhesive bond formed by solder that is applied between the upper leg portion 48 of the flexible joint connector 16 and the contact layer 22 of the integrated circuit chip 24 (see FIG. 1) is not capable of preventing a flexing of the flexible connector in the region A thereof.

Broken line portion 16' shows a position that the upper leg portion of the flex connector may take when flexed. This flexing may be due to vibration or changes in temperature, resulting in a lateral shift along the surface of the printed wiring board of the components relative to their fixed positions thereon. However, because flexible joint connector 16 is soldered to the chip contact layer and the conductor highway on the printed wiring board, a continuous electrical connection between the chip and the printed wiring board is achieved. It should also be noted that upper leg portion 48 may be lengthened to accommodate the vertical stacking of a plurality of IC chips (such as memory units) where common connections for the leadless contact areas of the chips are to be provided, (as in a memory expansion unit). Through this measure, printed wiring board real estate is conserved, yet continuous flexible connections to the chips are provided.

Figure 5:
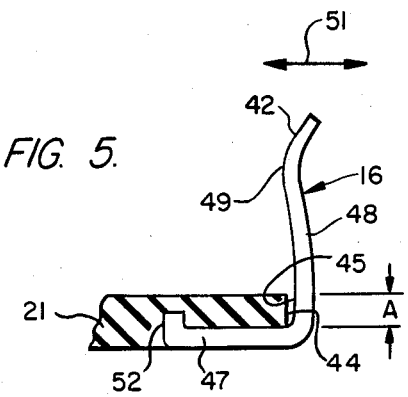
FIG. 5 is an enlarged cross-sectional sideview of a flexible connector and a portion of the insulated carrier substrate with the joint connector being molded into the carrier substrate.

Rather than use an adhesive material to join the flexible connector 16 to the insulated carrier substrate 21, the carrier 21 may be molded about the lower leg portion 47 of the flexible connector 16 as shown in FIG. 5. In this configuration, a bent or protruding portion 52 of the bottom leg portion 47 of connector 16 aids in securing the connector 16 to the carrier substrate 21. However, as in the embodiment shown in FIG. 4, there is no bonding of the inner surface 45 of upper leg portion 48 to the side edge 44 of substrate 21, to permit lateral translation or flexing of upper leg portion 48 in region A. Accordingly, as is the case with the embodiment shown in FIG. 4, the upper leg portion 48 of the flexible connector 16 is capable of flexing in the direction of arrows 51 at the region A to accommodate vibration and changes in temperature.

FIG. 6 illustrates the manner of manufacture and interconnection of the flexible connector and the integrated circuit chip. Portion (A) of FIG. 6 shows a pictorial view of the integrated circuit chip 24 which has a plurality of contact layers disposed along the edges thereof, individual contact area 23 being specifically identified.

Portion (D) of FIG. 6 shows how a metallic finger pattern may be etched or die cut in a suitable metallic or conductive material to form a pattern 61 having a plurality of fingers to be employed as the flexible connectors 15 and 16 of which are identified. Portion 15A of finger 15 and portion 16A of finger 16 are to be bonded to an insulated carrier substrate 21 shown in portion (C) of FIG. 6. Once the pattern has been etched or cut as shown in portion (D) of FIG. 6, the insulating carrier substrate may be bonded at portions A of each finger, in the manner described above with reference to FIG. 4, with the outer portion of the etched pattern material being removed to leave finger extensions as shown in (C) of FIG. 6. These finger extensions are then bent up and around the edges of the insulating carrier substrate 21 to obtain the configuration shown at portion (B) of FIG. 6 or the pictorial illustration shown in FIG. 2, rotated, of course, to be properly aligned with the edges of the leadless integrated circuit chip 24 shown a portion (A) of FIG. 6. The flexible connector and insulated carrier substrate configuration shown at portion (B) of FIG. 6 is soldered or otherwise bonded to selected portions of the conductor pattern on the printed wiring board in order to establish signal or voltage lead definitions for each of the fingers or flexible connectors. A leadless integrated circuit chip is then simply inserted into the flexible connector arrangement shown in portion (B) of FIG. 6 until the bottom of the chip rest upon the top of the insulated carrier substrate.

In this installed position, the tinned interior faces of the flexible connectors are mechanically urged against the outer surfaces of the chip contact layers on the integrated circuit chip. Solder material is then introduced into regions 61 and 62, described above with reference to FIG. 1, to form a fast electrical bond between the chip contact layers of the chip 24 and the flexible joint connectors abutting thereagainst.

In addition to providing a flexible but continuous electrical connection between the integrated circuit chip and the highways of the printed wiring board, the configuration of the present invention is capable of providing a heat sink facility between the chip and the exterior of the housing in which the printed wiring board is provided. For this purpose, in a region 31, designated by the broken lines in FIG. 1, a heat sink, of thermally conductive material may be provided. The central portion of the substrate 21 may be provided with a disk or other configured heat transfer material to extract heat away from the integrated circuit chip to the outside world.

Alternatively, internal conductor or external conductor highways may be provided on the insulated carrier substrate where common terminal voltages are provided among a plurality of pins, so as to increase the integrated circuit density of the chip itself while taking advantage of the flexible connector arrangement surrounding the chip. Namely, it is not uncommon for more than one external contact lead of an integrated circuit chip to require the same signal voltage or ground connection. To simplify, or more accurately, to eliminate, cumbersome external wiring, the insulated carrier substrate may be provided with connection highways therethrough for prescribed chip contact areas. These contact areas may be joined to the flexible connectors at the bottom surface of the substrate, such as at regions 35 and 36, to provide contiguous electrical connections thereat while still affording the desired environmental change capability.

It should also be noted that, because of this flexibility and simplified configuration, the flexible connectors may be easily and individually handled to effect the testing and removal of the integrated circuit chip packages retained thereby. The solder connection between each flexible connector and the leadless contact area on the integrated circuit chip may be easily removed through the use of a conventional fine pencil soldering iron so that, if necessary, the entire IC package may be replaced or selected leads individually tested without removal of the package.

As will be appreciated from the foregoing description, the present invention offers a number of advantages over conventional approaches for providing electrical connections between an integrated circuit package and a printed wiring board. The electrical connections provided between the IC package and the PWB remain intact regardless of changes in environmental conditions. Moreover, the numbers of components required and the actual size and complexity of the interconnection configuration is reduced compared with conventional schemes as exemplified by the above-described patents. This is an especially significant aspect of the present invention when considering its application to airborne environments, which not only encounter extreme changes in environmental conditions, but are subject to severe weight and size requirements. With its strength, flexibility properties and increased packaging density characteristics, the present invention is capable of satisfying all of these requirements.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. A multiple contact electrical connector arrangement connecting terminal contacts of a leadless integrated circuit package to a printed circuit board comprising, in combination:
   an insulated carrier substrate having top and bottom surfaces and a side surface portion therebetween;
   a plurality of flexible connector elements disposed along the periphery of said substrate in an arrangement corresponding to that of the terminal contacts of said leadless integrated circuit package, each of said elements having a first portion, affixed to said insulated carrier substrate at said bottom surface thereof and adapted to be bonded to a respective conductor path provided on said printed circuit board, and a second portion, extending from said first portion around said side surface portion of said substrate by which said periphery thereof is defined so as to form a separation between said side surface portion and said second portion, said second portion being flexibly translatable in the region of said side surface portion of said substrate; and wherein
   said first portion of a respective flexible connector element is bonded to a conductor path provided on said printed circuit board, and
   said second portion of said respective flexible connector element is bonded to a terminal contact of said leadless integrated circuit package at a location on said second portion of said respective flexible connector element spaced apart from said region of said side surface portion of said substrate.

2. A multiple contact electrical connector arrangement according to claim 1, wherein said first portion of a respective flexible connector element is bonded to a portion of said bottom surface of said insulated carrier substrate adjacent to said side surface portion of said substrate, said bottom surface of said substrate facing said printed circuit board.

3. A multiple contact electrical connector arrangement according to claim 1, wherein said first portion of a respective flexible connector element is molded into a portion of said bottom surface of said insulated carrier substrate adjacent to said side surface portion of said substrate, said bottom surface of substrate facing said printed circuit board.

4. A multiple contact electrical connector arrangement according to claim 1, wherein a respective flexible connector element is substantially L-shaped, said first portion of said flexible connector element corresponding to one leg of said L and said second portion of said flexible connector element corresponding to the other leg of said L.

5. A multiple contact electrical connector arrangement according to claim 4, wherein the end of said other leg of said L not joined with said one leg of said L is bent away from said insulated carrier substrate.

6. A multiple contact electrical connector for use in connecting terminal contacts of a leadless integrated circuit package to conductor paths provided on a printed circuit board comprising:
   an insulated carrier substrate having top and bottom surfaces and a side surface portion therebetween; and
   a plurality of flexible connector elements disposed along the periphery of said substrate in an arrangement corresponding to that of the terminal contacts of said leadless integrated circuit package, each of said elements having
   a first portion, affixed to said insulated carrier substrate at a bottom surface portion thereof and being adapted to be bonded to a respective conductor path provided on said printed circuit board, and
   a second portion, extending from said first portion around said side surface portion of said substrate by which said periphery thereof is defined, so as to form a separation between said side surface portion and said second portion, said second portion being flexibly translatable in the region of said side surface portion of said substrate and being urged in mechanical contact with a corresponding terminal contact of said leadless integrated circuit package by the placing of said leadless integrated circuit package upon the top surface of said insulated carrier substrate and being adapted to be bonded to a respective terminal contact of said leadless integrated circuit package at a location on said second portion spaced apart from said region of said side surface portion of said substrate.

7. A multiple contact electrical connector according to claim 6, wherein said first portion of a flexible connector element is bonded to a region of said bottom surface of said insulated carrier substrate adjacent to said side surface portion but exclusive of said side surface portion.

8. A multiple contact electrical connector according to claim 6, wherein said first portion of a flexible contact element is formed integrally with a region of said bottom surface portion of said insulated carrier substrate adjacent to said side surface portion of said substrate.

9. A multiple contact electrical connector according to claim 6, wherein said top and bottom surface portions of said insulated carrier substrate are substantially parallel with each other.

10. A multiple contact electrical connector according to claim 6, wherein said second portion of a flexible connector element is inclined toward said top surface of said insulated carrier substrate.

11. A multiple contact electrical connector according to claim 6, wherein said second portion of a respective flexible connector element is adapted to be soldered to a side portion of a respective terminal contact of said leadless integrated circuit package at a location on said second portion spaced apart from said region of said side surface portion of said substrate.

12. A multiple contact electrical connector according to claim 6, wherein a respective flexible connector element is substantially L-shaped, said first portion of said flexible connector element corresponding to one leg of said L and said second portion of said flexible connector element corresponding to the other leg of said L.

13. A multiple contact electrical connector according to claim 12, wherein the end of said other leg of said L not joined with said one leg of said L is bent away from said insulated carrier substrate.

14. A multiple contact electrical connector according to claim 6, wherein said second portion of a respective flexible connector element is bent inwardly, in the direction of the leadless integrated circuit package to be received thereby, and outwardly at the end thereof.

15. A multiple contact electrical connector according to claim 14, wherein said second portion of a respective flexible connector element is adapted to be soldered to the side portion of said leadless integrated circuit package at the inwardly bent portion of said second portion, the end of which is bent outwardly therefrom.

16. A multiple contact electrical connector arrangement connecting terminal contacts of a leadless integrated circuit package to a printed circuit board comprising, in combination:
an insulated carrier substrate having top and bottom surfaces and a side surface portion therebetween;
a plurality of flexible connector elements arranged on said substrate in correspondence with the terminal contacts of said leadless integrated circuit package, each of said elements having a first portion affixed to said insulated carrier substrate at said bottom surface thereof and adapted to be bonded to a respective conductor path provided on said printed circuit board, and a second portion extending from said first portion around said side surface portion of said substrate so as to form a separation between said side surface portion and said second portion and being flexibly translatable in the region of said side surface portion of said substrate so as to be engageable by the terminal contacts of said leadless integrated circuit package at a side portion of said leadless integrated circuit package, said second portion being also flexibly translatable in the region of said side portion of said leadless integrated circuit package to be engaged thereby; and wherein
said first portion of a respective flexible connector element is connected to a conductor path provided on said printed circuit board, and
said second portion of said respective flexible connector element is connected to a terminal contact of said leadless integrated circuit package at a location on said second portion of said respective flexible connector element spaced apart from said first portion of said connector element.

17. A multiple contact electrical connector arrangement according to claim 16, wherein said second portion of a respective flexible connector element is bent inwardly, in the direction of the leadless integrated circuit package to be received thereby, and outwardly at the end thereof.

18. A multiple contact electrical connector for use in connecting terminal contacts of a leadless integrated circuit package to conductor paths provided on a printed circuit board comprising:
an insulated carrier substrate having top and bottom surfaces and a side surface portion therebetween; and
a plurality of flexible connector elements arranged on said substrate in correspondence with the terminal contacts of said leadless integrated circuit package, each of said elements having
a first portion, affixed to said insulated carrier substrate at a bottom surface portion thereof and being adapted to be connected to a respective conductor path provided on said printed circuit board, and
a second portion, extending from said first portion so as to be extendable around a side portion of said substrate so as to form a separation between said side surface portion and said second portion, said second portion being flexibly translatable in the region of said side surface portion of said substate and said side portion of said leadless integrated circuit package so as to be mechanically urged in contact with a respective terminal contact of said leadless integrated circuit package upon said insulated carrier substrate and adapted to be electrically connected to said respective terminal contact of said leadless integrated circuit package at a location on said second portion spaced apart from said first portion of said connector element.

19. A multiple contact electrical connector according to claim 18, wherein said second portion of a respective flexible connector element is bent inwardly, in the direction of the leadless integrated circuit package to be received thereby, and outwardly at the end thereof.

20. A multiple contact electrical connector according to claim 18, wherein said second portion of a respective flexible connector element is adapted to be soldered to a side portion of a respective terminal contact of said leadless integrated circuit package at a location on said second portion spaced apart from said region of said side surface portion of said substrate.

21. A multiple contact electrical connector according to claim 19, wherein said second portion of a respective flexible connector element is adapted to be soldered to the side portion of said leadless integrated circuit package at the inwardly bent portion of said second portion, the end of which is bent outwardly therefrom.

* * * * *